(12) United States Patent  (10) Patent No.: US 6,448,779 B1
Beaver et al.                    (45) Date of Patent: Sep. 10, 2002

(54) WIRING TEST ASSEMBLY

(76) Inventors: Marty D. Beaver, 2415 West Ramsey St., Banning, CA (US) 92220; Roger P. Pruitt, 2415 West Ramsey St., Banning, CA (US) 92220

( * ) Notice: Subject to any disclaimer, the term of this patent is extended or adjusted under 35 U.S.C. 154(b) by 14 days.

(21) Appl. No.: 09/667,020

(22) Filed: Sep. 21, 2000

(51) Int. Cl.[7] .................. G01R 31/00; G01R 10/14; H01M 31/02; B60Q 11/00
(52) U.S. Cl. ................ 324/504; 324/133; 324/542; 324/556; 340/458
(58) Field of Search ................ 324/504, 133, 324/542, 556; 73/121; 340/458

(56) References Cited

U.S. PATENT DOCUMENTS

| | | | |
|---|---|---|---|
| 3,428,888 A | | 2/1969 | Notle |
| 4,065,751 A | * | 12/1977 | Stewart et al. ............... 340/58 |
| D278,984 S | | 5/1985 | Roberts, Sr. |
| 4,781,393 A | * | 11/1988 | Jeter ........................ 280/422 |
| 4,866,390 A | * | 9/1989 | Butchko ..................... 324/504 |
| 4,884,032 A | | 11/1989 | Lapensee |
| 5,086,277 A | | 2/1992 | Hammerly |
| 5,095,276 A | | 3/1992 | Nepil |
| 5,367,250 A | * | 11/1994 | Whisenand .................. 324/133 |
| 5,416,421 A | * | 5/1995 | Doland, Sr. et al. ........ 324/556 |
| 5,488,859 A | * | 2/1996 | Britt ........................ 73/121 |
| 5,549,470 A | * | 8/1996 | McGuire ..................... 439/35 |
| 5,602,482 A | | 2/1997 | Gutierrez |
| 5,635,843 A | * | 6/1997 | Borland ..................... 324/504 |
| 6,081,189 A | * | 6/2000 | Warner ....................... 340/458 |
| 6,089,907 A | * | 7/2000 | Shoblom ..................... 439/528 |
| 6,108,965 A | * | 9/2000 | Burrows et al. .............. 43/113 |

* cited by examiner

*Primary Examiner*—N. Le
*Assistant Examiner*—Wasseem H. Hamdan

(57) ABSTRACT

A wiring test assembly for validating and troubleshooting electrical problems with vehicle wiring assemblies for trailers. The wiring test assembly includes a housing with a bottom portion hingedly coupled to a top portion, a plurality of indicator lamps coupled to an exterior surface of the housing, and a wiring harness coupled to the plurality of indicator lamps and adapted for coupling to a trailer wiring connector.

11 Claims, 4 Drawing Sheets

WIRING TEST ASSEMBLY

BACKGROUND OF THE INVENTION

1. Field of the Invention

The present invention relates to electrical testers and more particularly pertains to a new wiring test assembly for validating and troubleshooting electrical problems with vehicle wiring assemblies for trailers.

2. Description of the Prior Art

The use of electrical testers is known in the prior art. More specifically, electrical testers heretofore devised and utilized are known to consist basically of familiar, expected and obvious structural configurations, notwithstanding the myriad of designs encompassed by the crowded prior art which have been developed for the fulfillment of countless objectives and requirements.

Known prior art includes U.S. Pat. No. 5,086,277; U.S. Pat. No. 4,884,032; U.S. Pat. No. 5,602,482; U.S. Pat. No. 5,095,276; U.S. Pat. No. 3,428,888; and U.S. Pat. No. Des. 278,984.

While these devices fulfill their respective, particular objectives and requirements, the aforementioned patents do not disclose a new wiring test assembly. The inventive device includes a housing with a bottom portion hingedly coupled to a top portion, a plurality of indicator lamps coupled to an exterior surface of the housing, and a wiring harness coupled to the plurality of indicator lamps and adapted for coupling to a trailer wiring connector.

In these respects, the wiring test assembly according to the present invention substantially departs from the conventional concepts and designs of the prior art, and in so doing provides an apparatus primarily developed for the purpose of validating and troubleshooting electrical problems with vehicle wiring assemblies for trailers.

SUMMARY OF THE INVENTION

In view of the foregoing disadvantages inherent in the known types of electrical testers now present in the prior art, the present invention provides a new wiring test assembly construction wherein the same can be utilized for validating and troubleshooting electrical problems with vehicle wiring assemblies for trailers.

The general purpose of the present invention, which will be described subsequently in greater detail, is to provide a new wiring test assembly apparatus and method which has many of the advantages of the electrical testers mentioned heretofore and many novel features that result in a new wiring test assembly which is not anticipated, rendered obvious, suggested, or even implied by any of the prior art electrical testers, either alone or in any combination thereof.

To attain this, the present invention generally comprises a housing with a bottom portion hingedly coupled to a top portion, a plurality of indicator lamps coupled to an exterior surface of the housing, and a wiring harness coupled to the plurality of indicator lamps and adapted for coupling to a trailer wiring connector.

There has thus been outlined, rather broadly, the more important features of the invention in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

It is therefore an object of the present invention to provide a new wiring test assembly apparatus and method which has many of the advantages of the electrical testers mentioned heretofore and many novel features that result in a new wiring test assembly which is not anticipated, rendered obvious, suggested, or even implied by any of the prior art electrical testers, either alone or in any combination thereof.

It is another object of the present invention to provide a new wiring test assembly which may be easily and efficiently manufactured and marketed.

It is a further object of the present invention to provide a new wiring test assembly which is of a durable and reliable construction.

An even further object of the present invention is to provide a new wiring test assembly which is susceptible of a low cost of manufacture with regard to both materials and labor, and which accordingly is then susceptible of low prices of sale to the consuming public, thereby making such wiring test assembly economically available to the buying public.

Still yet another object of the present invention is to provide a new wiring test assembly which provides in the apparatuses and methods of the prior art some of the advantages thereof, while simultaneously overcoming some of the disadvantages normally associated therewith.

Still another object of the present invention is to provide a new wiring test assembly for validating and troubleshooting electrical problems with vehicle wiring assemblies for trailers.

Yet another object of the present invention is to provide a new wiring test assembly which includes a housing with a bottom portion hingedly coupled to a top portion, a plurality of indicator lamps coupled to an exterior surface of the housing, and a wiring harness coupled to the plurality of indicator lamps and adapted for coupling to a trailer wiring connector.

Still yet another object of the present invention is to provide a new wiring test assembly that improves the safety of working on a vehicle on the side of the road by providing an auxiliary flasher unit which is positionable away for the vehicle.

Even still another object of the present invention is to provide a new wiring test assembly that provides a work light for facilitating working on a vehicle in the dark.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
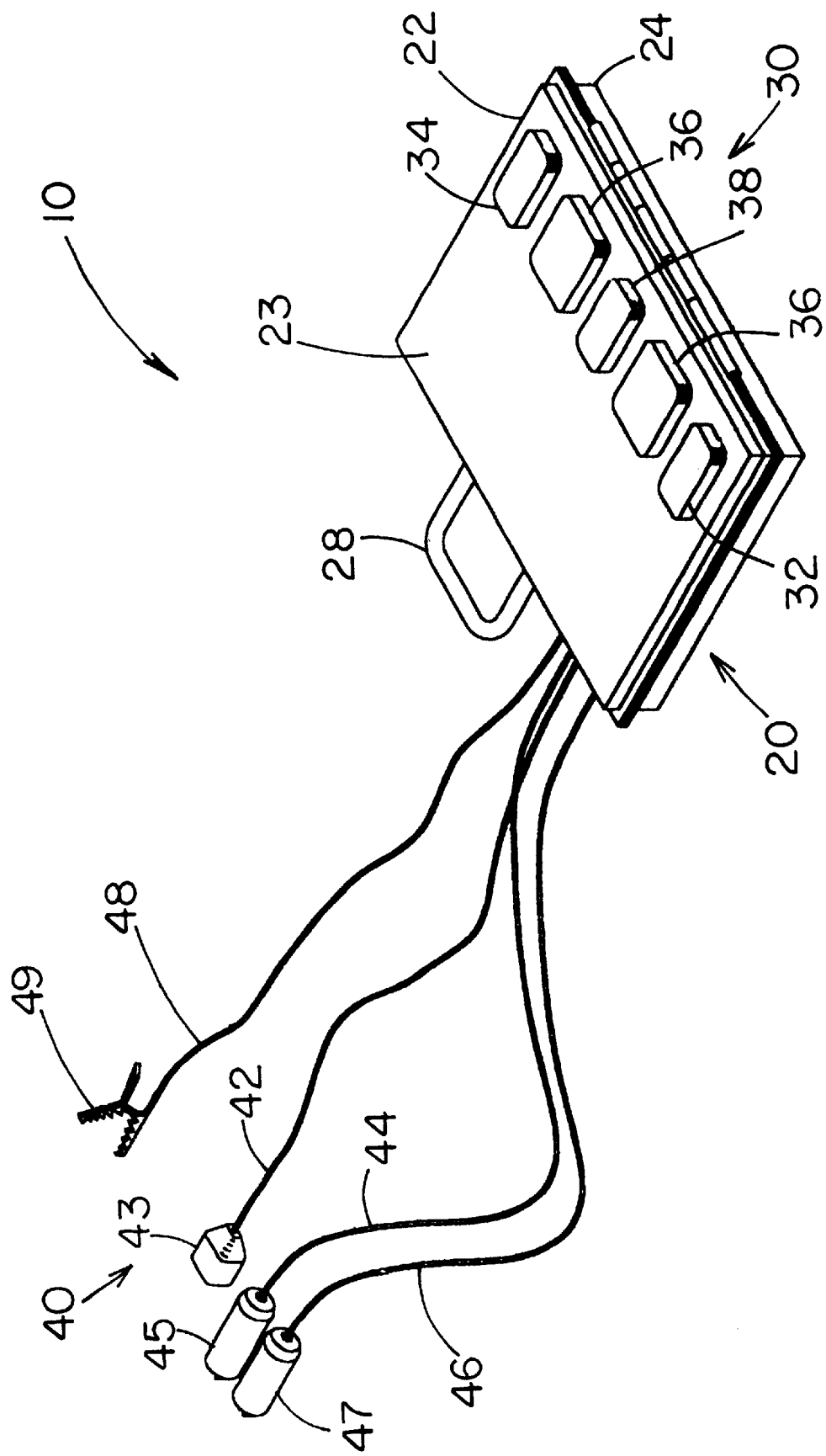
FIG. 1 is a schematic perspective view of a new wiring test assembly according to the present invention.
Figure 2:
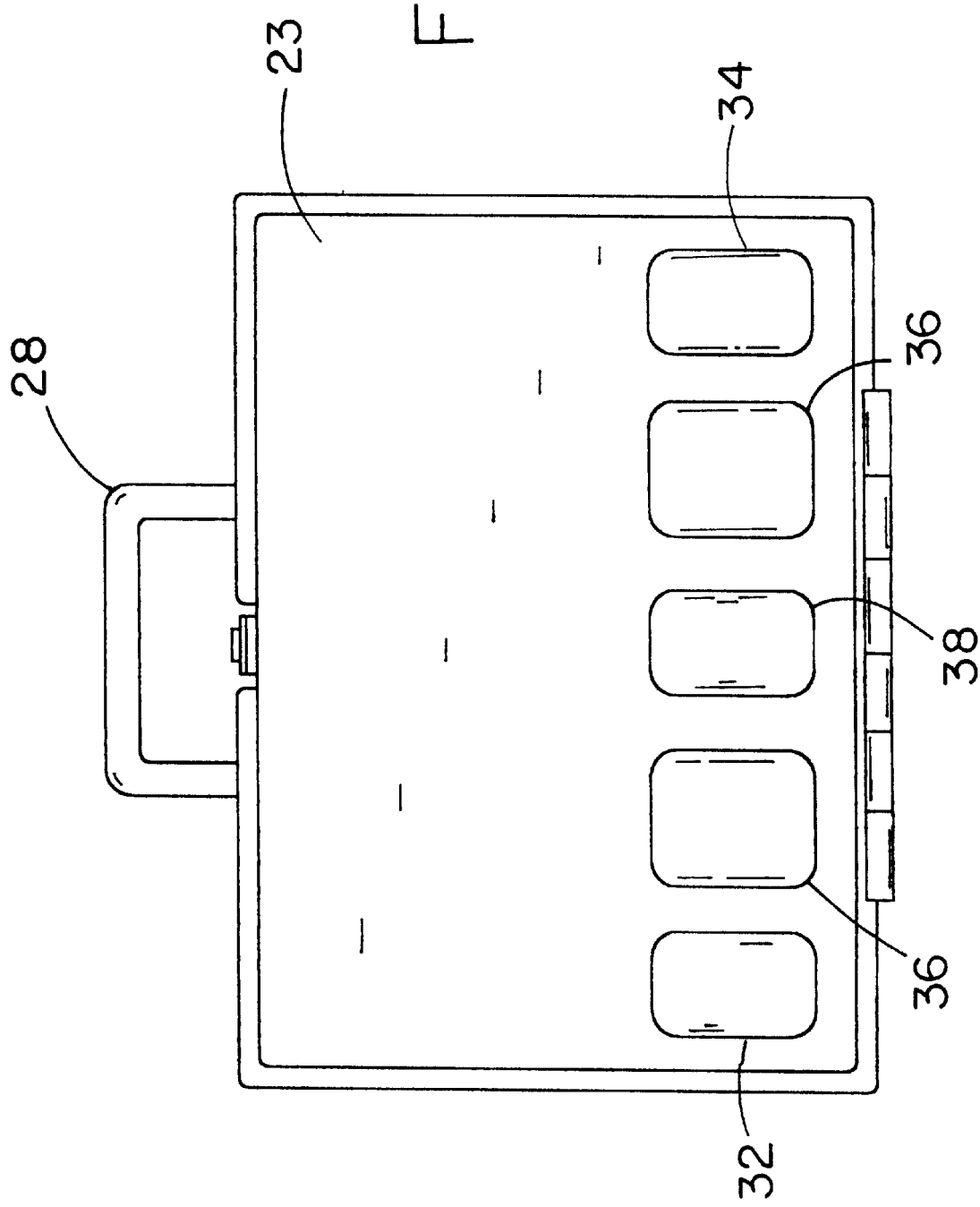
FIG. 2 is a schematic top view of the present invention.
Figure 3:
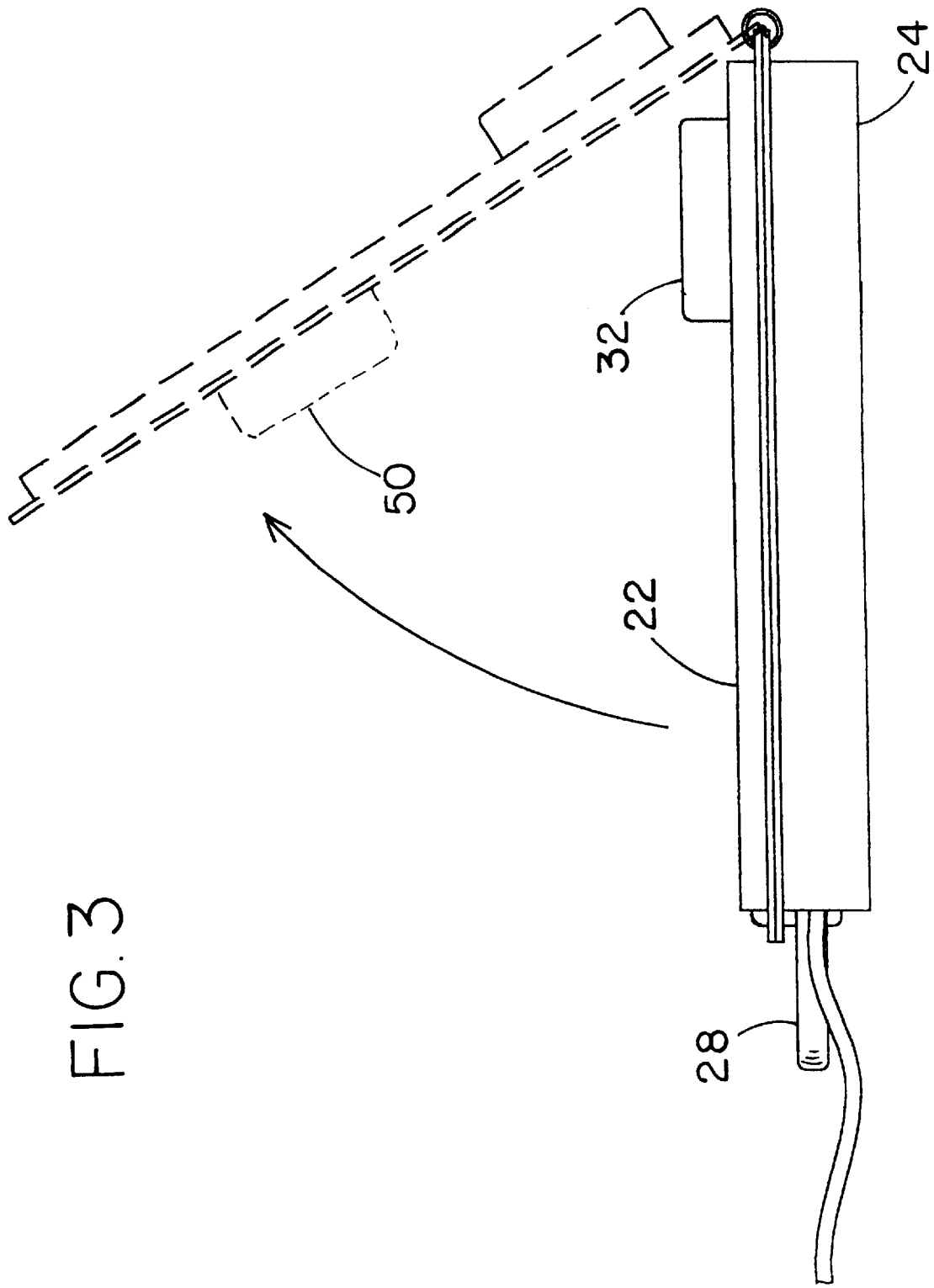
FIG. 3 is a schematic side view of the present invention taken along line 3—3, of FIG. 1.
Figure 4:
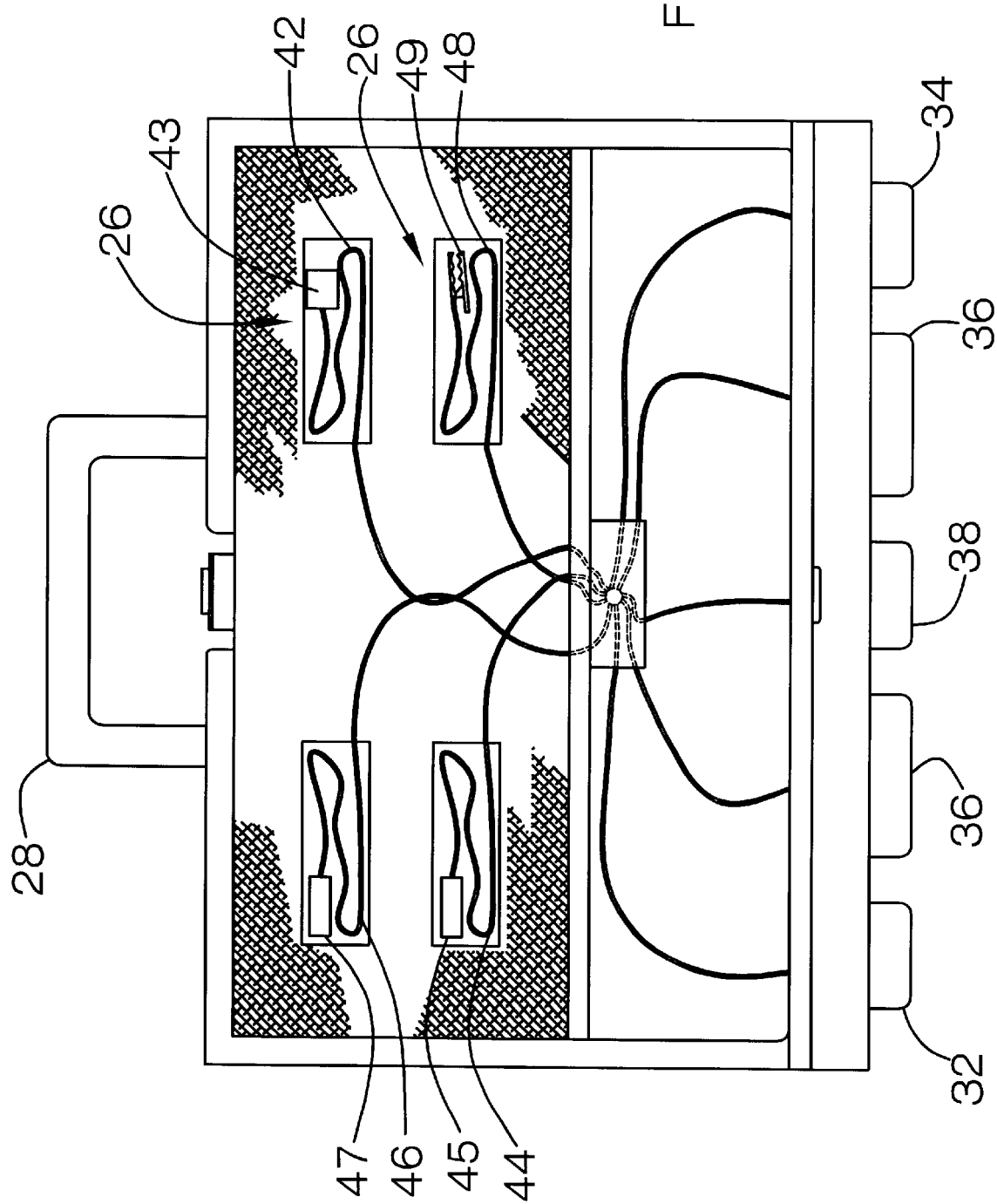
FIG. 4 is a schematic interior view of the present invention.

With reference now to the drawings, and in particular to FIGS. 1 through 4 thereof, a new wiring test assembly embodying the principles and concepts of the present invention and generally designated by the reference numeral 10 will be described.

As best illustrated in FIGS. 1 through 4, the wiring test assembly 10 generally comprises an housing 20, a plurality of indicator lamps 30, and a wiring assembly 40.

The housing 20 includes a bottom portion 24 and a top portion 22. The bottom portion 24 is hingedly coupled to the top portion 22.

The plurality of indicator lamps 30 is mounted to a surface of the top portion 22 of the housing 20.

The wiring assembly 40 is coupled to the plurality of indicator lamps 30. The wiring assembly 40 is designed for coupling to a trailer wiring connector of a vehicle. The wiring assembly 40 is positionable substantially within the housing 20.

The bottom portion 24 includes a bottom wall and four side walls. The four side walls each extend upwardly from the bottom wall. The bottom portion 24 includes a plurality of interior walls defining a plurality of cavities 26. Each of the cavities 26 is designed for receiving tools.

The top portion 22 includes a top wall 23 and four side walls. The four side walls each extend downwardly from the top wall 23. Each of the side walls is substantially aligned with an associate one of the side walls of the bottom portion 24.

The plurality of indicator lamps 30 includes a left turn signal indicator lamp 32, a right turn signal indicator lamp 34, a pair of tail/running indicator lamps 36, and a battery indicator lamp 38.

The left turn signal indicator lamp 32 is positioned on an exterior surface of the top wall 23 adjacent a first side of the top wall 23. The left turn signal indicator lamp 32 is illuminated when an electrical signal associated with a left turn signal from the vehicle is presented to the wiring assembly 40.

The right turn signal indicator lamp 34 is positioned on an exterior surface of the top wall 23 adjacent a second side of the top wall 23. The right turn signal indicator lamp 34 is illuminated when an electrical signal associated with the vehicle's right turn signal is presented to the wiring assembly 40.

Each one of the pair of tail/running light indicator lamps 36 preferably is positioned adjacent an associated right 34 or left turn signal indicator lamp 32 on an external surface of the top wall 23. Each one of the tail/running light indicator lamps 36 is illuminated when an electrical signal associated with the vehicle's tail lights is presented to the wiring assembly 40.

The battery indicator lamp 38 is positioned on an external surface of the top wall 23. The battery indicator lamp 38 is positioned preferably adjacent to the pair of tail/running light indicator lamps 36. The battery indicator lamp 38 is illuminated when an electrical signal associated with the vehicle's battery is presented to the wiring assembly 40.

The wiring assembly 40 includes a first test lead assembly 42, a second test lead assembly 44, and a third test lead assembly 46.

The first test lead assembly 42 includes a plurality of electrical conductors. Each one of the plurality of electrical conductors includes a first end and a second end. Each first end is connected to an associated one of the plurality of indicator lamps 30. Each second end is electrically coupled to a first plug member 43.

The second test lead assembly 44 includes a plurality of electrical conductors. Each one of the plurality of electrical conductors includes a first end and a second end. Each first end is connected to an associated one of the plurality of indicator lamps 30. Each second end is electrically coupled to a second plug member 45.

The third test lead assembly 46 includes a plurality of electrical conductors. Each one of the plurality of electrical conductors includes a first end and a second end. Each first end is connected to an associated one of the plurality of indicator lamps 30. Each second end is electrically coupled to a third plug member 47.

In an embodiment the first plug member 43 is a 4-way plug, the second plug member 45 is a 6-way plug, and the third plug member 47 is a 7-way plug.

A stand alone ground lead 48 includes a first end and a second end. The first end is electrically coupled to a clip member 49. The clip member 49 is designed for coupling to a metal portion of a vehicle such as a bumper or frame. The second end is electrically coupled to each of the plurality of indicator lamps 30 for providing a second independent ground path for electrical current. The stand alone ground lead 48 is designed for isolating grounding issues with the trailer wiring connector.

A work light 50 is coupled to an interior portion of the housing 20. The work light 50 is for providing illumination at night for working on the vehicle.

A handle portion 28 is coupled to an exterior surface of the housing 20. The handle portion 28 is for facilitating transportation of the wiring test assembly 10.

In use, the wiring test assembly is connected to the vehicle's trailer wiring connector using one of the test leads of the wiring assembly. The wiring test assembly is then positioned where the user can observe the plurality of indicator lamps while activating each of the vehicle's turn signals, brakes, and tail/running lights. If the indicator lamps illuminate intermittently or erratically then the stand alone ground lead is connected to the vehicle to verify the ground portion of the vehicle's trailer wiring connector.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A wiring test assembly comprising:
   an housing having a bottom portion and a top portion, said bottom portion being hingedly coupled to said top portion;
   a plurality of indicator lamps mounted to a surface of said top portion of said housing;
   a wiring assembly coupled to said plurality of indicator lamps, said wiring assembly being adapted for coupling to a trailer wiring connector of a vehicle, said wiring assembly being positioned substantially within said housing;
   wherein said wiring assembly further comprises:
      a first test lead assembly having a plurality of electrical conductors, each one of said plurality of electrical conductors having a first end and a second end, each first end being connected to an associated one of said plurality of indicator lamps, each second end being electrically coupled to a first plug member;
      a second test lead assembly having a plurality of electrical conductors, each one of said plurality of electrical conductors having a first end and a second end, each first end being connected to an associated one of said plurality of indicator lamps, each second end being electrically coupled to a second plug member;
      a third test lead assembly having a plurality of electrical conductors, each one of said plurality of electrical conductors having a first end and a second end, each first end being connected to an associated one of said plurality of indicator lamps, each second end being electrically coupled to a third plug member; and
      wherein said first plug member being a 4-way plug, said second plug member being a 6-way plug, said third plug member being a 7-way plug.

2. The wiring test assembly of claim 1, further comprising:
   said bottom portion having a bottom wall and four side walls extending upwardly from said bottom wall, said bottom portion having a plurality of interior walls defining a plurality of cavities, each of said cavities being adapted for receiving tools.

3. The wiring test assembly of claim 1, further comprising:
   said top portion having a top wall and four side walls extending downwardly from said top wall, each of said side walls being substantially aligned with an associate one of said side walls of said bottom portion.

4. The wiring test assembly of claim 1, wherein said plurality of indicator lamps further comprises:
   a left turn signal indicator lamp positioned on an exterior surface of said top wall adjacent a first side of said top wall, said left turn signal being illuminated when an electrical signal associated with a left turn signal from the vehicle when the vehicle's left turn signal is presented to said wiring assembly.

5. The wiring test assembly of claim 1, wherein said plurality of indicator lamps further comprises:
   a right turn signal indicator lamp positioned on an exterior surface of said top wall adjacent a second side of said top wall, said right turn signal being illuminated when an electrical signal associated with the vehicle's right turn signal is presented to said wiring assembly.

6. The wiring test assembly of claim 1, wherein said plurality of indicator lamps further comprises:
   a pair of tail/running light indicator lamps, each one of said tail/running light indicator lamps preferably being positioned adjacent an associated right or left turn signal indicator lamp on an external surface of said top wall. Each one of said tail/running light indicator lamps being illuminated when an electrical signal associated with the vehicle's tail lights is presented to said wiring assembly.

7. The wiring test assembly of claim 1, wherein said plurality of indicator lamps further comprises:
   a battery indicator lamp positioned on an external surface of said top wall, said battery indicator lamp being positioned preferably adjacent a pair of tail/running light indicator lamps, said battery indicator lamp being illuminated when an electrical signal associated with the vehicle's battery is presented to said wiring assembly.

8. The wiring test assembly of claim 1, wherein said wiring assembly further comprises:
   a stand alone ground lead having a first end and a second end, said first end being electrically coupled to a clip member, said clip member being adapted for coupling to a metal portion of a vehicle such as a bumper or frame, said second end being electrically coupled to each of said plurality of indicator lamps for providing a second independent ground path for electrical current, said stand alone ground lead being adapted for isolating grounding issues with said trailer wiring connector.

9. The wiring test assembly of claim 1, further comprising:
   a work light coupled to an interior portion of said housing, said work light being for providing illumination at night for working on the vehicle.

10. The wiring test assembly of claim 1, further comprising:
    a handle portion coupled to an exterior surface of said housing, said handle portion being for facilitating transportation of said wiring test assembly.

11. A wiring test assembly comprising:
    an housing having a bottom portion and a top portion, said bottom portion being hingedly coupled to said top portion;
    a plurality of indicator lamps mounted to a surface of said top portion of said housing;

a wiring assembly coupled to said plurality of indicator lamps, said wiring assembly being adapted for coupling to a trailer wiring connector of a vehicle, said wiring assembly being positioned substantially within said housing;

said bottom portion having a bottom wall and four side walls extending upwardly from said bottom wall, said bottom portion having a plurality of interior walls defining a plurality of cavities, each of said cavities being adapted for receiving tools;

said top portion having a top wall and four side walls extending downwardly from said top wall, each of said side walls being substantially aligned with an associate one of said side walls of said bottom portion;

said plurality of indicator lamps further comprises:
- a left turn signal indicator lamp positioned on an exterior surface of said top wall adjacent a first side of said top wall, said left turn signal being illuminated when an electrical signal associated with a left turn signal from the vehicle when the vehicle's left turn signal is presented to said wiring assembly;
- a right turn signal indicator lamp positioned on an exterior surface of said top wall adjacent a second side of said top wall, said right turn signal being illuminated when an electrical signal associated with the vehicle's right turn signal is presented to said wiring assembly;
- a pair of tail/running light indicator lamps, each one of said tail/running light indicator lamps preferably being positioned adjacent an associated right or left turn signal indicator lamp on an external surface of said top wall. Each one of said tail/running light indicator lamps being illuminated when an electrical signal associated with the vehicle's tail lights is presented to said wiring assembly;
- a battery indicator lamp positioned on an external surface of said top wall, said battery indicator lamp being positioned preferably adjacent a pair of tail/running light indicator lamps, said battery indicator lamp being illuminated when an electrical signal associated with the vehicle's battery is presented to said wiring assembly;

said wiring assembly further comprises:
- a first test lead assembly having a plurality of electrical conductors, each one of said plurality of electrical conductors having a first end and a second end, each first end being connected to an associated one of said plurality of indicator lamps, each second end being electrically coupled to a first plug member;
- a second test lead assembly having a plurality of electrical conductors, each one of said plurality of electrical conductors having a first end and a second end, each first end being connected to an associated one of said plurality of indicator lamps, each second end being electrically coupled to a second plug member;
- a third test lead assembly having a plurality of electrical conductors, each one of said plurality of electrical conductors having a first end and a second end, each first end being connected to an associated one of said plurality of indicator lamps, each second end being electrically coupled to a third plug member;

wherein said first plug member being a 4-way plug, said second plug member being a 6-way plug, said third plug member being a 7-way plug;
- a stand alone ground lead having a first end and a second end, said first end being electrically coupled to a clip member, said clip member being adapted for coupling to a metal portion of a vehicle such as a bumper or frame, said second end being electrically coupled to each of said plurality of indicator lamps for providing a second independent ground path for electrical current, said stand alone ground lead being adapted for isolating grounding issues with said trailer wiring connector;

a work light coupled to an interior portion of said housing, said work light being for providing illumination at night for working on the vehicle; and a handle portion coupled to an exterior surface of said housing, said handle portion being for facilitating transportation of said wiring test assembly.

* * * * *